(12) United States Patent
Tsubouchi

(10) Patent No.: US 12,289,827 B2
(45) Date of Patent: Apr. 29, 2025

(54) PRINTED BOARD AND ELECTRONIC DEVICE

(71) Applicant: Kioxia Corporation, Tokyo (JP)

(72) Inventor: Yuta Tsubouchi, Tokyo (JP)

(73) Assignee: Kioxia Corporation, Tokyo (JP)

( * ) Notice: Subject to any disclaimer, the term of this patent is extended or adjusted under 35 U.S.C. 154(b) by 419 days.

(21) Appl. No.: 17/695,072

(22) Filed: Mar. 15, 2022

(65) Prior Publication Data

US 2022/0408555 A1 Dec. 22, 2022

(30) Foreign Application Priority Data

Jun. 18, 2021 (JP) ................................. 2021-101858

(51) Int. Cl.
*H05K 1/02* (2006.01)
*H05K 1/03* (2006.01)

(52) U.S. Cl.
CPC ......... *H05K 1/0298* (2013.01); *H05K 1/0306* (2013.01); *H05K 1/038* (2013.01)

(58) Field of Classification Search
CPC .... H05K 1/0298; H05K 1/0306; H05K 1/038; H05K 1/0219; H05K 2201/029; H05K 1/024; H05K 1/0366; H05K 1/0243; H05K 1/0245; H05K 1/0256; H05K 1/0296
USPC ........................................................ 361/760
See application file for complete search history.

(56) References Cited

U.S. PATENT DOCUMENTS

| | | | | |
|---|---|---|---|---|
| 5,997,983 A | * | 12/1999 | Caron | H05K 1/0366 |
| | | | | 442/232 |
| 9,226,404 B2 | * | 12/2015 | Ai | H05K 1/0248 |
| 10,506,705 B2 | | 12/2019 | Kondou et al. | |
| 2007/0223205 A1 | | 9/2007 | Liang et al. | |
| 2009/0253278 A1 | * | 10/2009 | Chen | H05K 1/0216 |
| | | | | 439/70 |
| 2011/0078895 A1 | | 4/2011 | Suwada | |
| 2011/0308840 A1 | | 12/2011 | Ooi et al. | |
| 2016/0006131 A1 | * | 1/2016 | Matsumura | H01Q 1/2283 |
| | | | | 343/834 |
| 2018/0177043 A1 | * | 6/2018 | Li | H05K 1/0245 |

(Continued)

FOREIGN PATENT DOCUMENTS

| | | |
|---|---|---|
| CN | 102291926 A | 12/2011 |
| JP | 2015-050294 A | 3/2015 |
| JP | 2017-073460 A | 4/2017 |

(Continued)

*Primary Examiner* — Timothy J Thompson
*Assistant Examiner* — Paramita Ghosh
(74) *Attorney, Agent, or Firm* — Oblon, McClelland, Maier & Neustadt, L.L.P.

(57) ABSTRACT

A printed board includes a first and second insulator extending in a first direction; a third insulator extending in a second direction and including a first and second portion located above and below the first insulator respectively in a third direction; a fourth insulator extending in the second direction, and including a third and fourth portion located below and above the first insulator respectively in the third direction; and a first and second conductor extending in the first direction, and arranged along the second direction with a first pitch therebetween. The first pitch is an n multiple of a first distance that is based on an interval between the first and second portion or the third and fourth portion. The n is an integer equal to or greater than 1.

20 Claims, 12 Drawing Sheets

(56) References Cited

U.S. PATENT DOCUMENTS

2018/0242443 A1* 8/2018 Tanaka .................. H05K 1/038
2019/0357350 A1 11/2019 Kashiwakura

FOREIGN PATENT DOCUMENTS

| | | |
|---|---|---|
| JP | 2020-043190 A | 3/2020 |
| TW | 200806143 | 1/2008 |
| TW | 201125450 A1 | 7/2011 |
| TW | 201206262 A1 | 2/2012 |

* cited by examiner

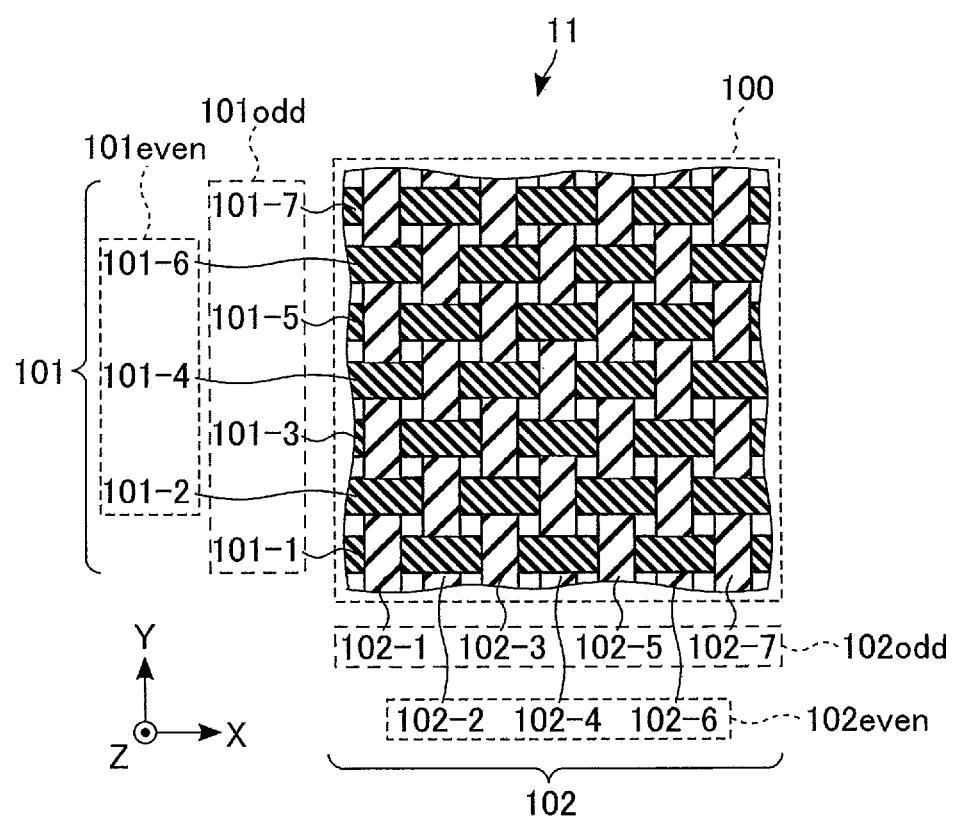
F I G. 3

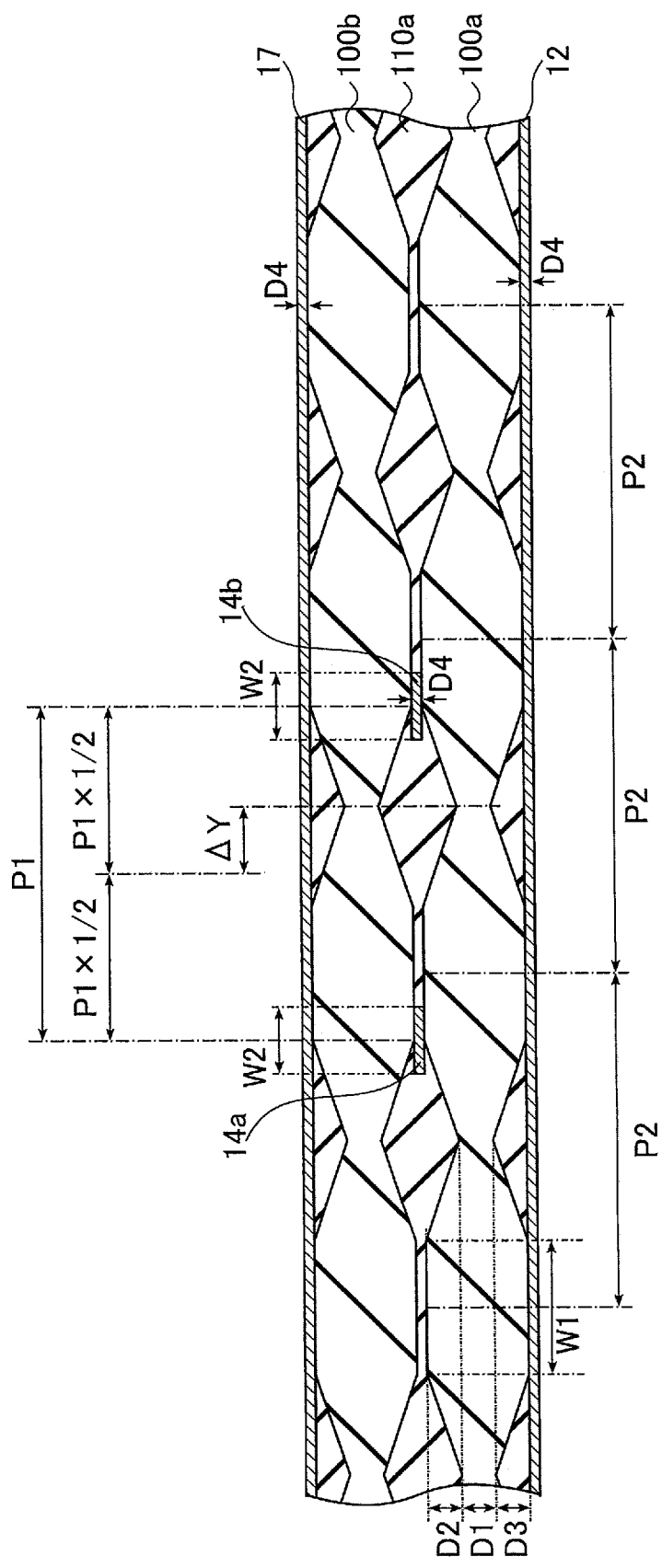
F I G. 5

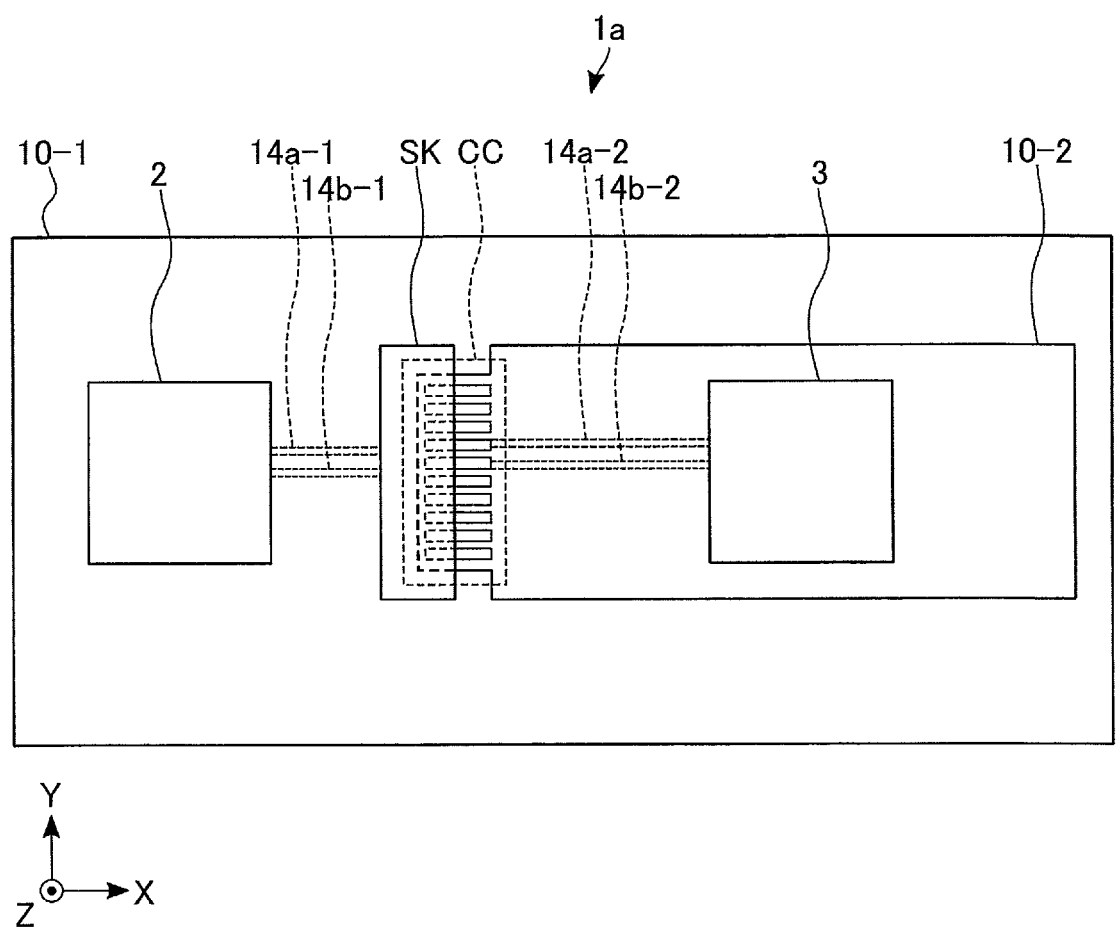
F I G. 14

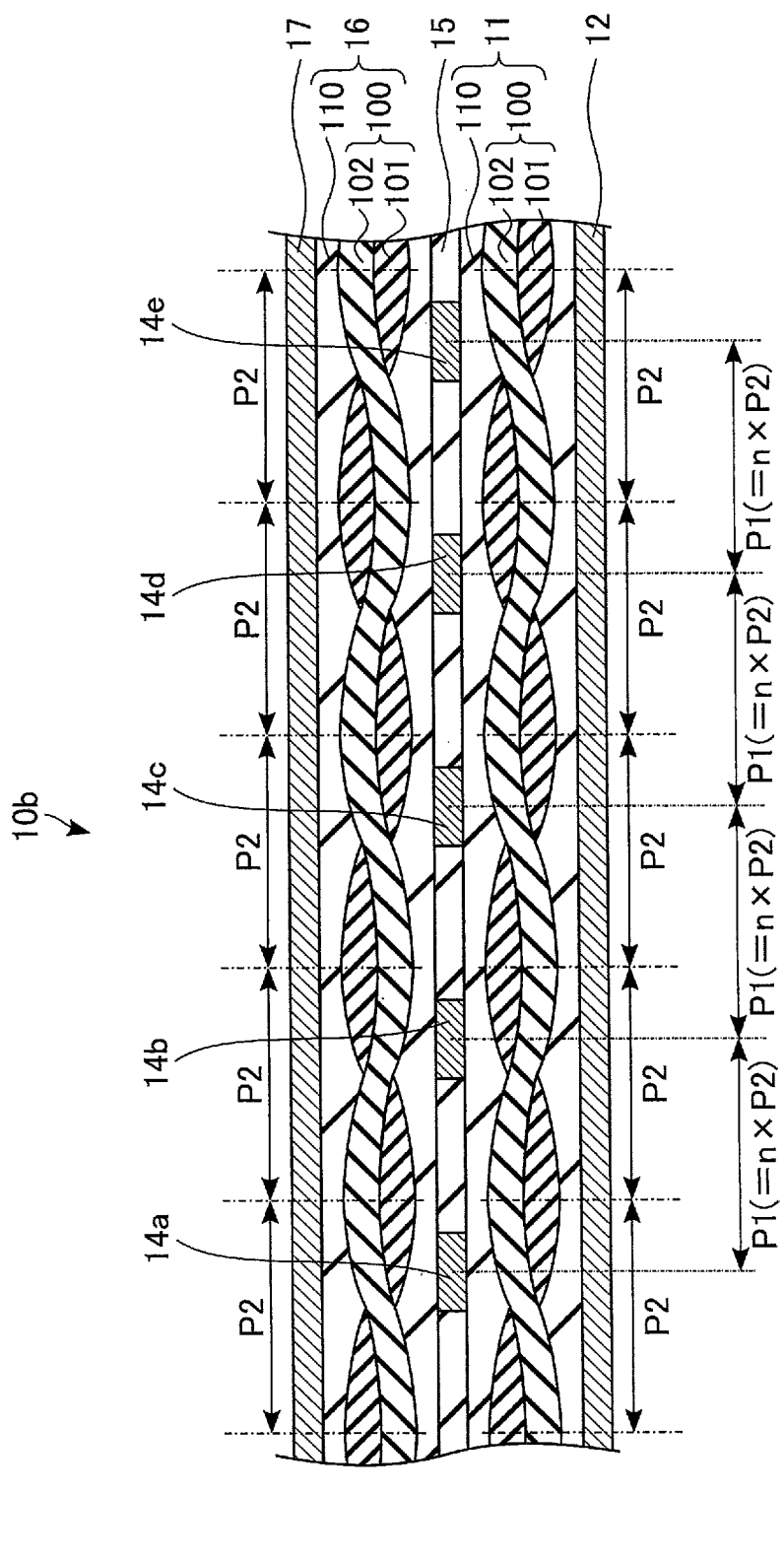
F I G. 15

PRINTED BOARD AND ELECTRONIC DEVICE

CROSS-REFERENCE TO RELATED APPLICATIONS

This application is based upon and claims the benefit of priority from Japanese Patent Application No. 2021-101858, filed Jun. 18, 2021, the entire contents of which are incorporated herein by reference.

FIELD

Embodiments described herein relate generally to a printed board and an electronic device.

BACKGROUND

A printed circuit board including a glass fiber-made glass cloth and an electronic device employing such a printed circuit board are known. A glass cloth refers to a type of fabric woven from multiple glass fibers and having an insulating property. The printed circuit board also includes conductive interconnects (or substrate wirings, or printed wirings). The interconnects in the printed circuit board, when employed in an electronic device, often transmit signals of relatively high frequencies.

BRIEF DESCRIPTION OF THE DRAWINGS

FIG. 3 is a plan view of the printed board according to the embodiment and shows a planar structure along the line III-III.

FIG. 5 is a sectional view showing a sectional structure of a printed board model used in simulations.

FIG. 14 is a plan view showing an exemplary structure of an electronic device according to a second modification of the embodiment.

FIG. 15 is a sectional view of a part of a printed board according to a third modification of the embodiment.

DETAILED DESCRIPTION

In general, according to one embodiment, a printed board includes a first insulator and a second insulator each extending in a first direction, the first insulator and the second insulator being next to each other along a second direction crossing the first direction; a third insulator extending in the second direction and including a first portion and a second portion, the first portion overlapping the first insulator and located above the first insulator in a third direction crossing the first direction and the second direction, the second portion overlapping the second insulator and located below the second insulator in the third direction; a fourth insulator located next to the third insulator in the first direction, extending in the second direction, and including a third portion and a fourth portion, the third portion overlapping the first insulator and located below the first insulator in the third direction, the fourth portion overlapping the second insulator and located above the second insulator in the third direction; and a first conductor and a second conductor each extending in the first direction, and arranged along the second direction with a first pitch therebetween. The first pitch is an n multiple of a first distance that is based on an interval between the first portion and the second portion or an interval between the third portion and the fourth portion. The n is an integer equal to or greater than 1.

Embodiments will be described with reference to the drawings. The description will use the same reference symbols for the structural features or components having the same or substantially the same functions and configurations. Also, the description will set forth each embodiment as an example of the technical ideas. The embodiments are not intended to bind on materials, shapes, structures, arrangements, etc. of the structural features or components. The embodiments may be modified in various ways. In the description of the embodiments below, an expression such as "contact", "adjacent", or the like embraces both the meaning of direct contact and the meaning of indirect contact through one or more intervening media.

[1] Embodiments

A printed board according to an embodiment, as well as an electronic device including the printed board will be described.

[1-1] Configurations

[1-1-1] General Configuration of Electronic. Device 1

Figure 1:
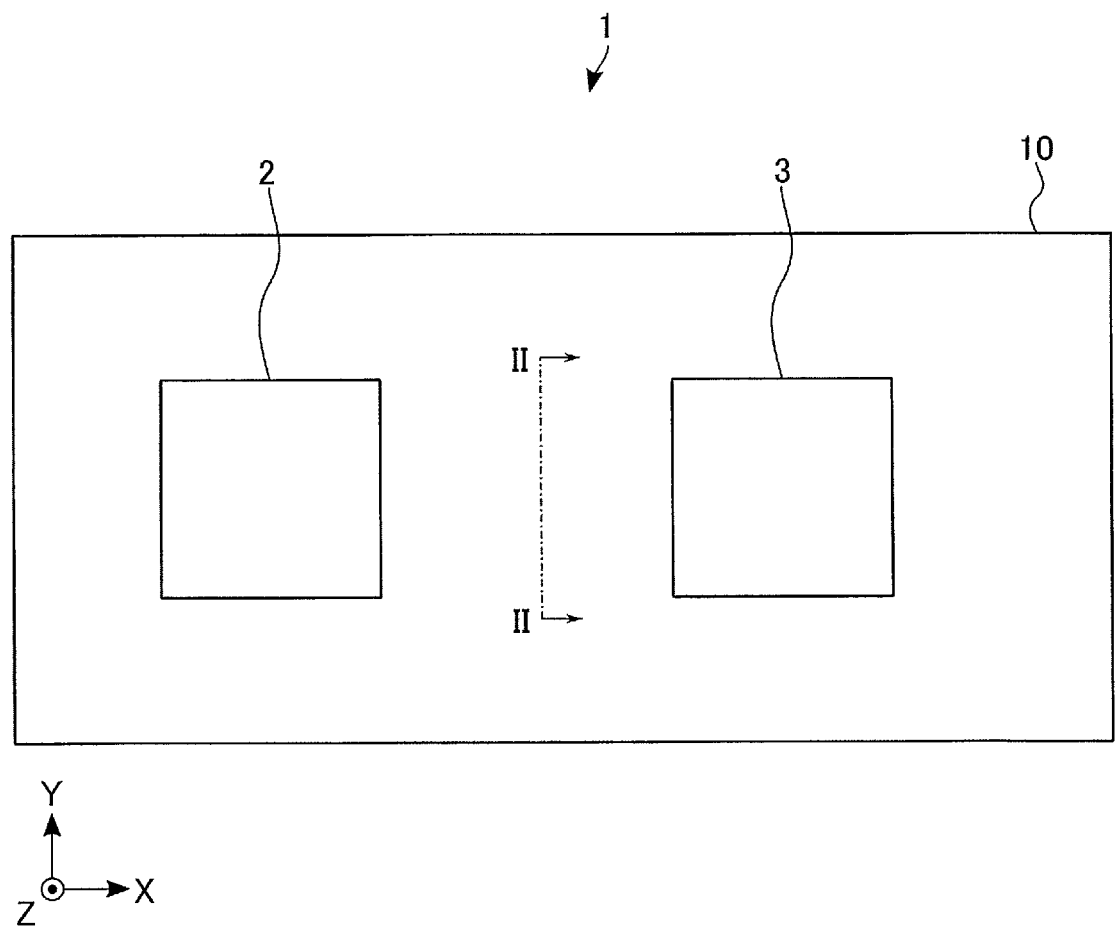
FIG. 1 is a plan view showing an exemplary structure of an electronic device according to an embodiment.

FIG. 1 is plan view showing an exemplary structure of an electronic device according to the embodiment. As shown in FIG. 1, the electronic device according to the embodiment, denoted by "1", includes a transmitter 2, a receiver 3, and a printed circuit board 10 (hereinafter, simply called the "printed board 10").

The transmitter 2 is, for example, a packaged device constituted by a resin-enclosed integrated circuit (IC) chip. The transmitter 2 is disposed on the printed board 10. The transmitter 2 is adapted to transmit signals to the receiver 3 via one or more interconnects (not illustrated) of the printed board 10.

The receiver 3 is, for example, a packaged device constituted by a resin-enclosed IC chip. The receiver 3 is disposed on the printed board 10. The receiver 3 is adapted to receive signals transmitted by the transmitter 2 via one or more interconnects of the printed board 10.

The printed board 10 is a multi-layered substrate including multiple interconnects (or substrate wirings, or printed wirings) formed of conductors.

Note that, in the drawings referred to in this description, an X direction and a Y direction are set as directions which together define a plane parallel to the surface of the printed board 10. Also, a Z direction is set as a direction perpendicular to the surface of the printed board 10. For the description of the embodiments, it will be assumed that the surface of the printed board 10 where the transmitter 2 and the receiver 3 are disposed is a "top face" of the printed board 10. The surface of the printed board 10 where the transmitter 2 and the receiver 3 are not disposed is a "bottom face" of the printed board 10. For the description of the embodiments, it will also be assumed that a direction from the bottom face to the top face of the printed board 10 along the Z direction is an "upward" direction. A direction from the top face to the bottom face of the printed board 10 along the Z direction is a "downward" direction. Moreover, for the description of the embodiments, it will be assumed that a top-face side as viewed in the Z direction from the bottom face is an "upper side", and that the top face is located "above" or "over" (or in a +Z direction from) the bottom face. A bottom-face side as viewed in the Z direction from the top face is a "lower side", and the bottom face is located "below" or "under" (or in a −Z direction from) the top face. The embodiments may instead adopt a structure where the transmitter 2 is disposed on one of the top face and the bottom face of the printed board 10, with the receiver 3 being disposed on the other face.

[1-1-2] Configuration of Printed Board 10
(General Structure of Printed Board 10)

Figure 2:
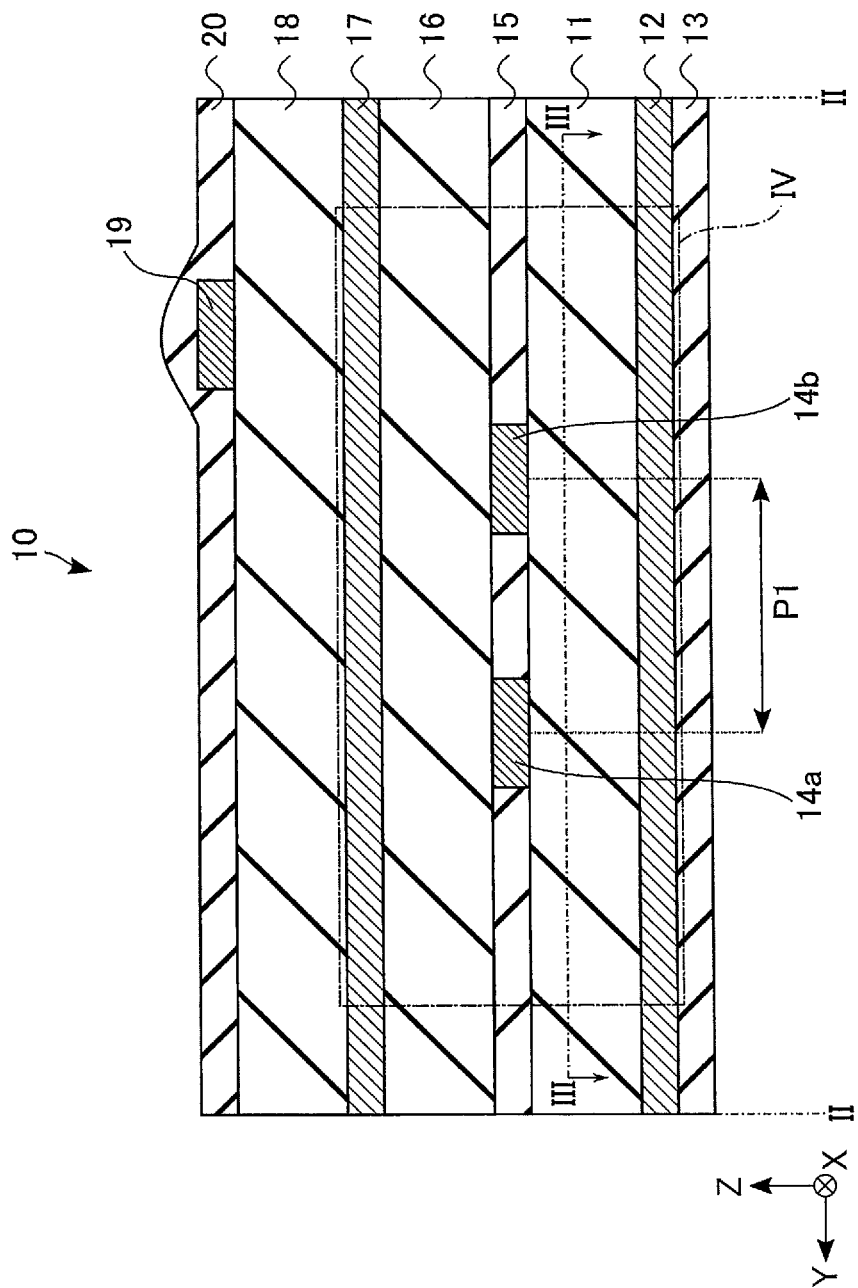
FIG. 2 is a sectional view of a printed board according to the embodiment and shows a sectional structure along the line II-II.

FIG. 2 is a sectional view of the printed board 10 according to the embodiment and shows its sectional structure along the line II-II (indicated in FIG. 1). As shown in FIG. 2, the printed board 10 is a multi-layered substrate including insulators 11, 13, 15, 16, 18, and 20, and conductors 12, 14a, 14b, 17, and 19.

The insulator 11 is a substrate having an insulating property. The insulator 11 extends over the X-Y plane. The insulator 11 electrically isolates the interconnects provided above it from the interconnects provided below it.

The conductor 12 is an interconnect (or substrate wiring, or printed wiring) having a conducting property. The conductor 12 contacts the insulator 11 at an upper side thereof and extends over the X-Y plane. The conductor 12 electrically connects the transmitter 2 and the receiver 3 to each other using, for example, non-illustrated vias. The conductor 12 is applied with a ground voltage for operations of the electronic device 1. The ground voltage is a ground potential or a reference potential in the electronic device 1. As such, the conductor 12 may also be called a "ground layer".

The insulator 13 is a solder resist. The insulator 13 covers a lower side of the conductor 12. The insulator 13 electrically isolates the conductor 12 from the outside of the printed board 10.

The conductors 14a and 14b are each an interconnect (or substrate wiring, or printed wiring) having a conducting property. The conductors 14a and 14b serve as a pair of interconnects for transmitting differential signals. The conductors 14a and 14b and the insulator 15 contact the insulator 11 at a lower sides thereof. The conductors 14a and 14b each extends in the X direction. The conductors 14a and 14b are arranged along the Y direction. The conductors 14a and 14b transmit differential signals from the transmitter 2 to the receiver 3 using, for example, non-illustrated vias. The embodiment assumes pitches for multiple conductors arranged along a given direction, and each such pitch represents a length or a distance along the given direction from the center of one conductor to the center of its neighboring conductor. Here, the Y-direction pitch for the conductors 14a and 14b is defined as a "pitch P1".

The insulator 15 is a substrate having an insulating property. The insulator 15 contacts the insulator 11 at a lower side thereof and extends over the X-Y plane. The insulator 15 has a portion formed between the conductors 14a and 14b so as to electrically isolate the conductors 14a and 14b from each other.

The insulator 16 is a substrate having an insulating property. The insulator 16 contacts each of the conductors 14a and 14b and the insulator 15 at a lower side thereof and extends over the X-Y plane. The insulator 16 electrically isolates the interconnects provided above it from the interconnects provided below it (e.g., the conductors 14a and 14b).

The conductor 17 is an interconnect (or substrate wiring, or printed wiring) having a conducting property. The conductor 17 contacts the insulator 16 at a lower side thereof and extends over the X-Y plane. The conductor 17 electrically connects the transmitter 2 and the receiver 3 to each other using, for example, non-illustrated vias. The conductor 17 is applied with the ground voltage for operations of the electronic device 1. The conductor 17 may also be called a "ground layer".

The insulator 18 is a substrate having an insulating property. The insulator 18 contacts the conductor 17 at a lower side thereof and extends over the X-Y plane. The insulator 18 electrically isolates the interconnects provided above it from the interconnects provided below it (e.g., the conductor 17).

The conductor 19 is an interconnect (or substrate wiring, or printed wiring) having a conducting property. The conductor 19 contacts the insulator 18 at a lower side thereof. The conductor 19 extends in the X direction. The conductor 19 transmits signals from the transmitter 2 to the receiver 3 without using vias.

The insulator 20 is a solder resist. The insulator 20 covers an upper side of the conductor 19. The insulator 20 also covers the regions of an upper side of the insulator 18, where the conductor 19 is absent. The insulator 20 electrically isolates the conductor 19 from the outside of the printed board 10.

(Weave Structure 100)

FIG. 3 is a plan view of the printed board 10 according to the embodiment and shows its planar structure along the line (indicated in FIG. 2). Namely, FIG. 3 shows, in the X-Y plane, a partial planar structure of the insulator 11 included in the printed board 10.

The insulator 11 includes a weave structure 100. The weave structure 100 includes multiple insulators 101 and multiple insulators 102. In the part shown in FIG. 3, the multiple insulators 101 include insulators 101-1 to 101-7. Also, in the part shown in FIG. 3, the multiple insulators 102 include insulators 102-1 to 102-7.

The weave structure 100 serves as a base of the insulator 11. The weave structure 100 has a plain-woven constitution in which the insulators 101 and 102 are used. The insulators 101 are used as the weft of the weave structure 100. The insulators 102 are used as the warp of the weave structure 100. The weave structure 100 may take the form of, for example, a glass cloth. In that case, each of the insulators 101 and 102 is a glass fiber.

The multiple insulators 101 each extends in the X direction and are arranged along the Y direction. The multiple insulators 102 each extends in the Y direction and are arranged along the X direction. By way of example, the insulators 101-1 and 101-2, and the insulators 102-1 and 102-2 will be described in detail.

The insulators 101-1 and 101-2 each extends in the X direction and are arranged next to each other along the Y direction.

The insulator 102-1 extends in the Y direction. The insulator 102-1 includes an upper portion overlapping the insulator 101-1 and located over the insulator 101-1, and a lower portion overlapping the insulator 101-2 and located under the insulator 101-2.

The insulator 102-2 is arranged next to the insulator 102-1 along the X direction and extends in the Y direction. The insulator 102-2 has a lower portion overlapping the insulator 101-1 and located under the insulator 101-1, and an upper portion overlapping the insulator 101-2 and located over the insulator 101-2.

In the description below, the odd-numbered insulators 101, such as the insulators 101-1, 101-3, 101-5, and 101-7, will be called "insulators 101odd". The even-numbered insulators 101, such as the insulators 101-2, 101-4, and 101-6, will be called "insulators 101even". Also, the odd-numbered insulators 102, such as the insulators 102-1, 102-3, 102-5, and 102-7, will be called "insulators 102odd". The even-numbered insulators 102, such as the insulators 102-2, 102-4, and 102-6, will be called "insulators 102even".

The consecutively arranged insulators 101odd and 101even and the consecutively arranged insulators 102odd and 102even together form a structure analogous to that formed by the insulators 101-1 and 101-2 and the insulators 102-1 and 102-2, described above as an example. That is, the weave structure 100 has a pattern in which a structure as described with reference to the insulators 101-1 and 101-2 and the insulators 102-1 and 102-2 is repeated in the X and Y directions. Specifically, the insulators 101odd and 101even are alternately arranged a number of times along the Y direction. Each insulator 102 alternately includes the upper portion and the lower portion a number of times along the Y direction. The insulators 102odd and 102even are alternately arranged a number of times along the X direction. Each insulator 101 alternately includes the upper portion and the lower portion a number of times along the X direction.

Note that the insulators 16 and 18 include their respective weave structures 100 similar to that of the insulator 11.

(Detailed Structure of Printed Board 10)

Figure 4:
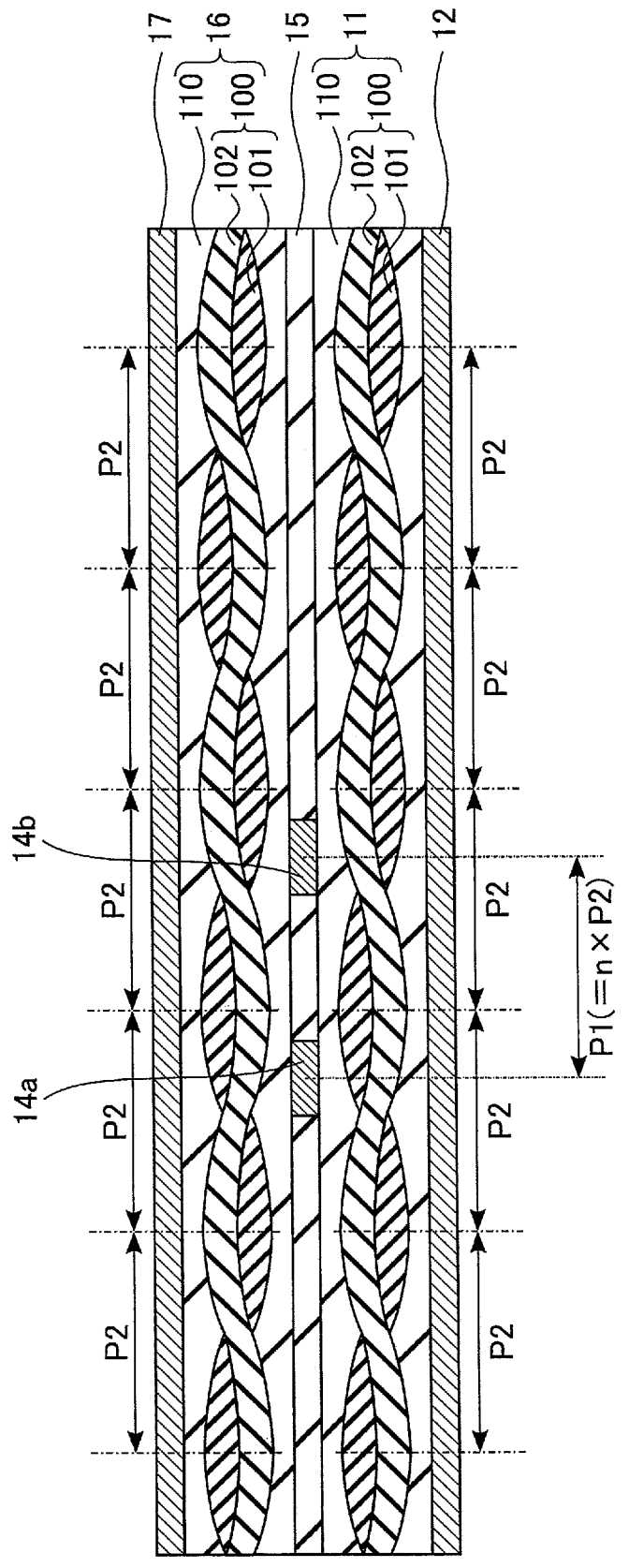
FIG. 4 is a sectional view of the printed board according to the embodiment and shows a detailed sectional structure of the region IV.

FIG. 4 is a sectional view of the printed board 10 according to the embodiment and shows a sectional structure of the region IV (indicated in FIG. 2). Namely, FIG. 4 shows the sectional structure of the printed board 10 in the Y-Z plane. As shown in FIG. 4, the insulators 11 and 16 each further includes an insulator 110. The description will assume that a thickness refers to a length, a size, or a height along the Z direction.

As shown in FIG. 4, the weave structure 100 has a larger thickness in Z-direction at each portion (hereinafter, also called as a larger thickness portion) where the insulators 101 and 102 overlap each other, i.e., the location of each upper portion or lower portion of the insulator 102. Here, a location on one upper portion of the insulator 102, where the weave structure 100 has the maximum thickness, is defined as a position of this upper portion. Also, a location on one lower portion of the insulator 102, where the weave structure 100 has the maximum thickness, is defined as a position of this lower portion. In the insulator 102, the Y-direction interval between the positions of the upper portion and the lower portion, which are formed next to each other, is defined as a "cycle P2". The cycle P2 corresponds to a length, a size, or a distance along the Y direction. The cycle P2 may instead be called a "pitch P2". Since the set of one upper portion and one lower portion of the insulator 102 is provided multiple times along the Y direction, the weave structure 100 repeats the larger thickness portion along the Y direction at the cycle P2. For illustrative purposes, the larger thickness portion of the weave structure 100 will be called an "antinode".

The weave structure 100 has a smaller thickness in Z-direction at each portion (hereinafter, also called as a smaller thickness portion) where the insulators 101 and 102 do not overlap each other. The structure 100 repeats the smaller thickness portion along the Y direction at the cycle P2, similar to the larger thickness portions. For illustrative purposes, the smaller thickness portion of the weave structure 100 will be called a "node".

The insulator 110 is an epoxy resin. The insulator 110 fills the spaces in the weave structure 100 and also covers the weave structure 100. As such, the insulator 110 functions as a reinforcing member for the weave structure 100. Also, each of the insulators 11 and 16, formed using the respective insulators 110, has a top face and a bottom face conforming to a flat X-Y plane. Accordingly, the layers in the printed board 10 are each allowed to retain flatness.

In the portions of the insulator 11 where the respective antinodes of the weave structure 100 are located, the Z-direction thickness of the weave structure 100 is large and that of the insulator 110 is small. Also, in the portions of the insulator 11 where the respective nodes of the weave structure 100 are located, the Z-direction thickness of the weave structure 100 is small and that of the insulator 110 is large. The insulator 16 is of a similar structure. Note that, while FIG. 4 omits illustration, the insulator 18 may include its weave structure 100 and insulator 110 in a manner analogous to the insulators 11 and 16.

The conductors 14a and 14b are disposed so that the Y-direction pitch P1 is an integer equal to or greater than 1 multiple of the cycle P2 of the weave structure 100, namely, P1=n×P2, where n is an integer equal to or greater than 1. What is shown in FIG. 4 is an example where the pitch P1 equals the cycle P2 (the case of n=1).

[1-2] Effects

With the printed board 10 according to the embodiment described above, variations in characteristics of the interconnects in the printed board 10 can be suppressed. Effects of the printed board 10 according to the embodiment will be explained in detail.

The printed board 10 includes the base member (i.e., each weave structure 100) and the reinforcing member (i.e., the corresponding insulator 110), which differ from each other in physical values such as relative permittivity and dielectric tangent. Due to this, the printed board 10 could involve variations in such physical values (e.g., a relative permittivity and a dielectric tangent) between a portion where the base member is thick and the reinforcing member is thin and a portion where the base member is thin and the reinforcing member is thick. The multiple interconnects, disposed in the portions differing in physical values, could vary their characteristics as well.

In the printed board 10 according to the embodiment, the conductors 14a and 14b functioning as interconnects to transmit differential signals are provided with the pitch P1 that is set between them, which is an integer (1 or greater) multiple of the cycle P2 of each weave structure 100. Since the pitch P1 between the conductors 14a and 14b and the cycle P2 of each weave structure 100 are in the relationship that the former is an integer (1 or greater) multiple of the latter, the structure of the printed board 10 along the thickness direction (i.e., the Z direction), where the conductor 14a is provided, is substantially the same as the structure of the printed board 10 along the thickness direction, where the conductor 14b is provided. Therefore, variations in characteristics of the interconnects can be suppressed.

A variation in characteristics of the interconnects for transmitting differential signals would degrade the signal qualities and limit the speed or the frequency of signals that can be transmitted via the interconnects. The printed board 10 according to the embodiment can suppress variations in characteristics of the interconnects, and accordingly, allows for the steady transmission of high-speed or high-frequency signals. That is, the electronic device 1 including the printed board 10 according to the embodiment allows for the steady transmission of high-speed or high-frequency signals from the transmitter 2 to the receiver 3.

[2] Evaluation Based on Simulations

A model of the printed board was prepared according to the foregoing embodiment and a comparative example described later, and simulations and evaluation were performed for characteristics of the interconnects. The printed board model used in the simulations, conditions for the simulations, and the results of the simulations will be described one by one.

[2-1] Printed Board Model Used in Simulations

To carry out the simulations, a printed board model concisely expressing the structure of the printed board 10 as discussed for the embodiment was prepared. FIG. 5 is a sectional view showing a sectional structure of the printed board model used in the simulations. As shown in FIG. 5, the printed board model used in the simulations includes weave structures 100a and 100b, an insulator 100a, and conductors 12, 14a, 14b, and 17. Note that the section shown in FIG. 5 corresponds to FIG. 4.

The weave structure 100a corresponds to the weave structure 100 included in the insulator 11 discussed for the embodiment. The weave structure 100b corresponds to the weave structure 100 included in the insulator 16 discussed for the embodiment. The insulator 110a corresponds to each of the insulators 110 included in the respective insulators 11 and 16, and also to the insulator 15 itself.

The weave structure 100a repeats the change in Z-direction thickness at the cycle P2 along the Y direction. The weave structure 100a has a thickness D1 at each node. The thickness at each antinode of the weave structure 100a is larger than the node thickness D1 by a thickness D2 in the upward Z direction and by a thickness D3 in the downward Z direction. The antinode of the weave structure 100a accounts for a width W1 along the Y direction at the center region between the neighboring nodes. The weave structure 100b is of a kind similar to the weave structure 100a.

In the printed board model used in the simulations, the weave structures 100a and 100b each reaches the thickness equal to the thickness of the corresponding insulator 11 or 16 discussed for the embodiment. In other words, the antinodes of the weave structures 100a and 100b have portions directly contacting the adjacent conductors.

The conductors 12, 14a, 14b, and 17 each has a thickness D4. The conductors 14a and 14b are arranged with the Y-direction pitch P1 therebetween. The conductors 14a and 14b each has a width W2 along the Y direction. Further, a distance along the Y direction from a midpoint between the conductors 14a and 14b to the position of the node of the weave structure 100a, that is closer to the midpoint, is defined as "$\Delta Y$".

The simulations used the following values for the respective parameters.

P2: 500 μm
W1: 200 μm
W2: 100 μm
D1: 50 μm
D2: 50 μm
D3: 50 μm
D4: 15 μm

Also, the X-direction length of each of the conductors 14a and 14b was set to be 5 mm. For the simulations, the weave structures 100a and 100b in the printed board model were set to have a relative permittivity of 5.5, and the insulator 110a was set to have a relative permittivity of 3.6.

Figure 6:
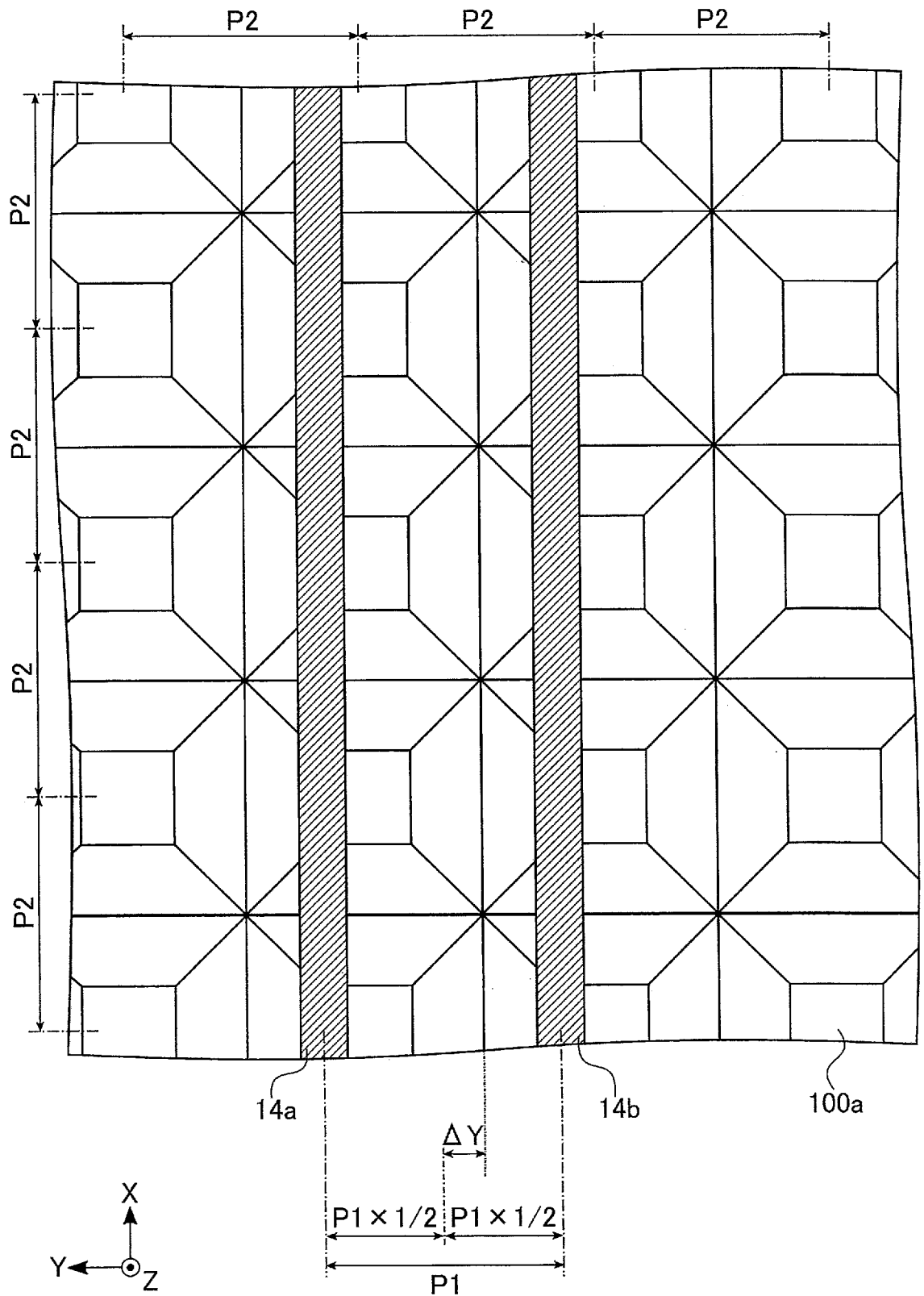
FIG. 6 is a plan view showing an X-Y planar structure of the printed board model used in the simulations.

FIG. 6 is a plan view showing an X-Y planar structure of the printed board model used in the simulations. The illustration of FIG. 6 focuses on the weave structure 100a and the conductors 14a and 14b among the printed board model used in the simulations.

As shown in FIG. 6, the weave structure 100a repeats its thickness change in a cyclic manner also along the X direction, as in the case along the Y direction. FIG. 6 shows the example where the thickness changes at the cycle P2 along both the directions X and Y. The weave structure 100b is of a structure similar to the weave structure 100a.

Note that, in the examples shown in FIGS. 5 and 6, the pitch P1 between the conductors 14a and 14b is set to be 1 times (equal to) the cycle P2 of the weave structure 100a.

[2-2] Conditions for Simulations

Simulations were performed for a first example and a second example according to the embodiment and also for a comparative example. Conditions adopted in each example and particulars of the simulations will be explained.

First, conditions adopted in each example will be explained. In the first example according to the embodiment, the pitch P1 between the conductors 14a and 14b was set to be 500 μm. In other words, the first example according to the embodiment used the pitch P1 between the differential interconnects that was 1 times the cycle P2 of the weave structure 100a.

In the second example according to the embodiment, the pitch P1 between the conductors 14a and 14b was set to be 1000 μm. In other words, the second example according to the embodiment used the pitch P1 between the differential interconnects that was 2 times the cycle P2 of the weave structure 100a.

In the comparative example, the pitch P1 between the conductors 14a and 14b was set to be 230 μm. That is, the comparative example used the pitch P1 between the differential interconnects that was not an integer (1 or greater) multiple of the cycle P2 of the weave structure 100a.

Next, particulars of the simulations will be explained. In the simulations, the $\Delta Y$ value was varied from 0 μm to 100 μm by 10 μm so as to determine the characteristics exhibited by the interconnects at each/Y value.

The characteristics of the interconnects intended by the simulations included a differential pass characteristic Sdd21 and a differential-to-common mode conversion characteristic Scd21. The differential pass characteristic Sdd21 represents an amount of attenuation occurring in a differential signal when the differential signal passes through differential interconnects. It is preferable that the attenuation amount represented by the differential pass characteristic Sdd21 be kept low. The differential-to-common mode conversion characteristic Scd21 represents a degree of conversion from a differential signal into a common mode signal when the differential signal passes through differential interconnects. It is preferable that the conversion degree represented by the differential-to-common mode conversion characteristic Scd21 be kept low.

[2-3] Results of Simulations

Figure 7:
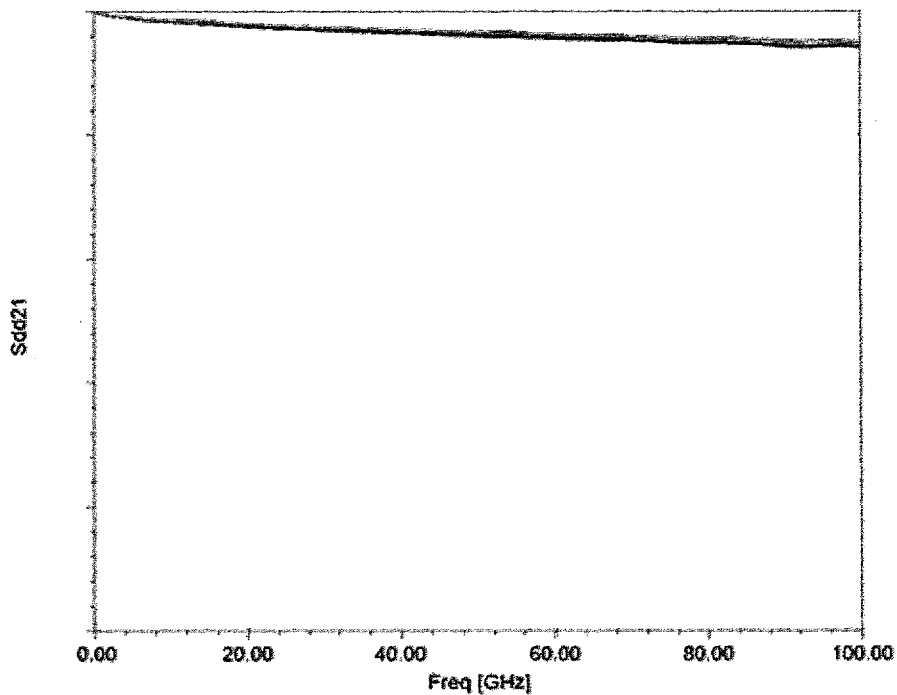
FIG. 7 is a graph showing a relationship between a differential pass characteristic and a frequency in a first example according to the embodiment.
Figure 8:
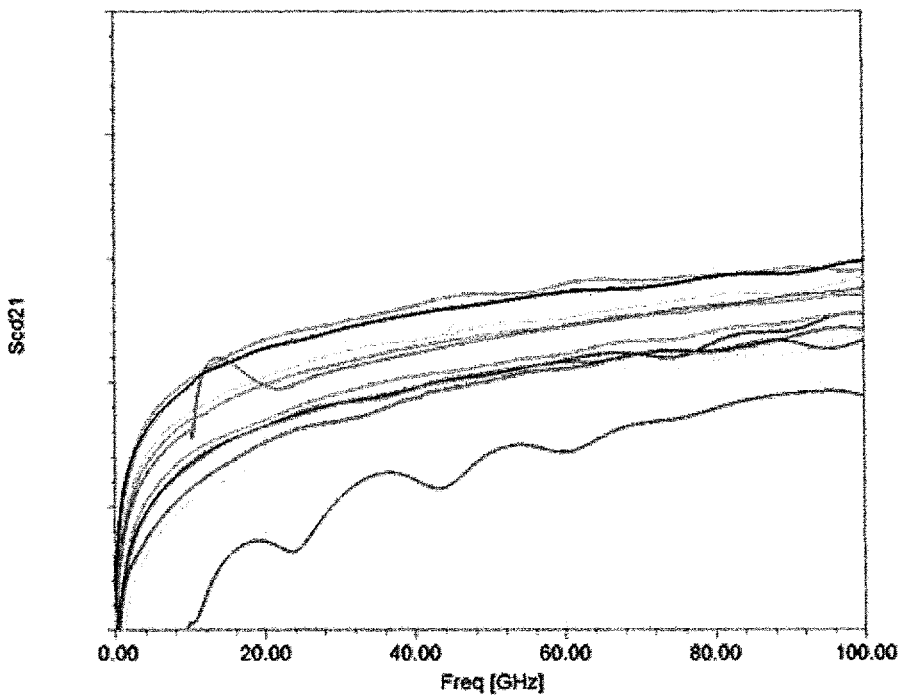
FIG. 8 is a graph showing a relationship between a differential-to-common mode conversion characteristic and a frequency in the first example according to the embodiment.
Figure 9:
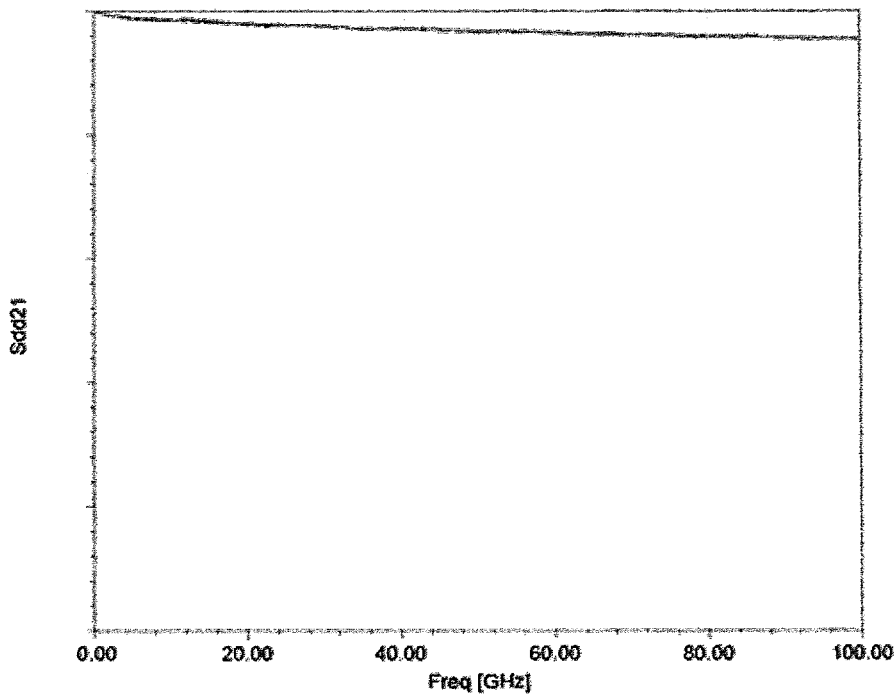
FIG. 9 is a graph showing a relationship between a differential pass characteristic and a frequency in a second example according to the embodiment.
Figure 10:
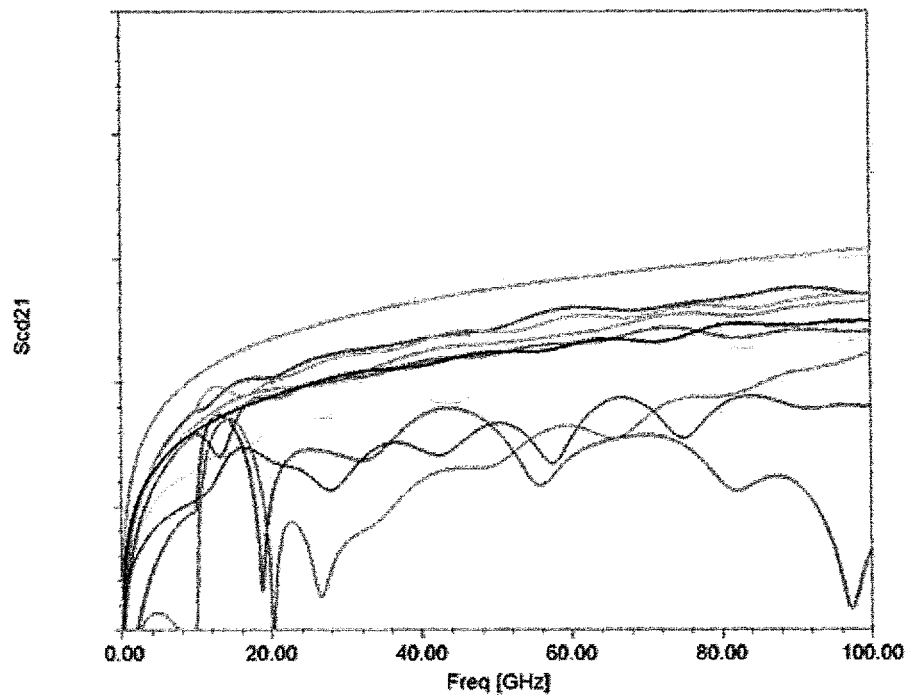
FIG. 10 is a graph showing a relationship between a differential-to-common mode conversion characteristic and a frequency in the second example according to the embodiment.
Figure 11:
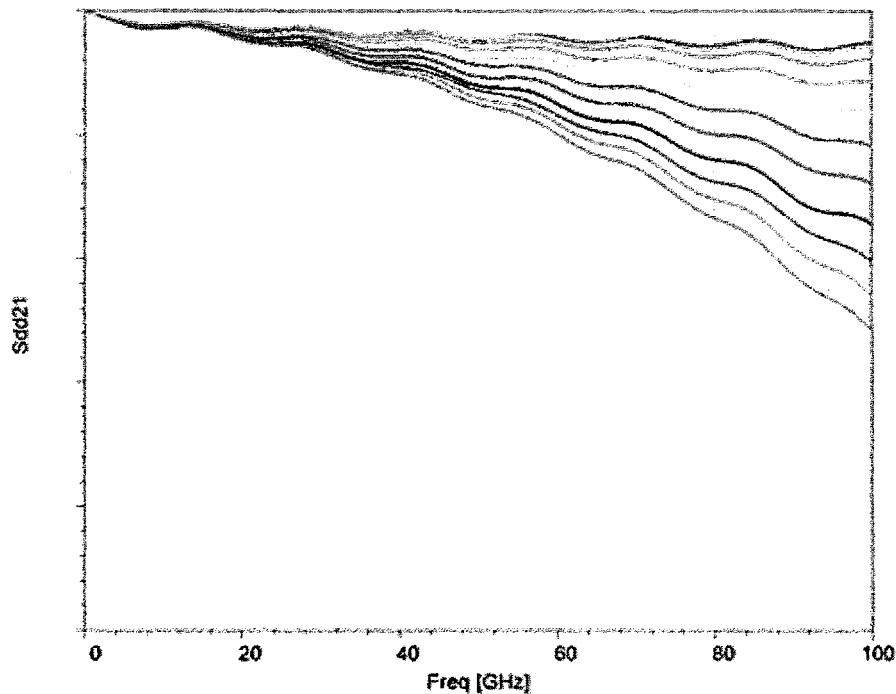
FIG. 11 is a graph showing a relationship between a differential pass characteristic and a frequency in a comparative example.
Figure 12:
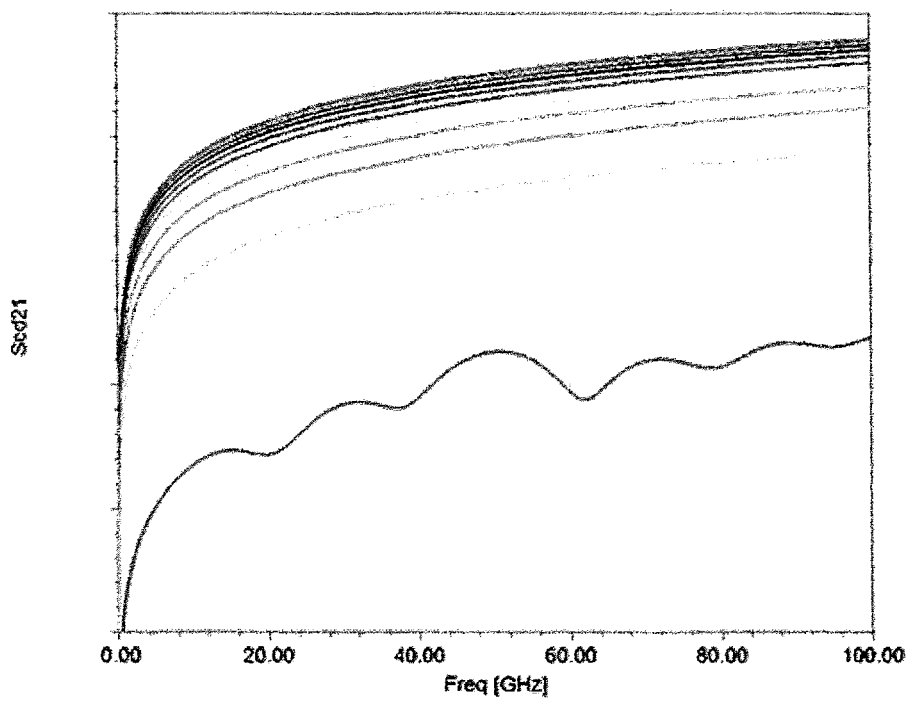
FIG. 12 is a graph showing a relationship between a differential-to-common mode conversion characteristic and a frequency in the comparative example.

FIGS. 7 to 12 show results of the simulations. FIG. 7 is a graph showing a relationship between the differential pass characteristic Sdd21 and the frequency, obtained for the first example according to the embodiment. FIG. 8 is a graph showing a relationship between the differential-to-common mode conversion characteristic Scd21 and the frequency, obtained for the first example according to the embodiment. FIG. 9 is a graph showing a relationship between the differential pass characteristic Sdd21 and the frequency, obtained for the second example according to the embodiment. FIG. 10 is a graph showing a relationship between the differential-to-common mode conversion characteristic Scd21 and the frequency, obtained for the second example according to the embodiment. FIG. 11 is a graph showing a relationship between the differential pass characteristic Sdd21 and the frequency, obtained for the comparative example. FIG. 12 is a graph showing a relationship between the differential-to-common mode conversion characteristic Scd21 and the frequency, obtained for the comparative example.

FIGS. 7, 9, and 11 each indicates the differential pass characteristic Sdd21 using the vertical axis. Here, on the vertical axis in each of FIGS. 7, 9, and 11, a lower indicates that the differential pass characteristic Sdd21 is a negative number with a larger absolute value. FIGS. 7, 9, and 11 set the same range for their vertical axes. FIGS. 8, 10, and 12 each indicates the differential-to-common mode conversion characteristic Scd21 using the vertical axis. Here, on the vertical axis in each of FIGS. 8, 10, and 12, a lower indicates that the differential-to-common mode conversion characteristic Scd21 is a negative number with a larger absolute value. FIGS. 8, 10, and 12 set the same range for their vertical axes. The unit of the vertical axis in each of FIGS. 7 to 12 is decibel. FIGS. 7 to 12 each indicates frequencies using the horizontal axis. The unit of the horizontal axis in each of FIGS. 7 to 12 is gigahertz (GHz). FIGS. 7 to 12 each shows multiple lines as results of the simulations performed with the various ΔY values.

As seen from FIGS. 7 and 9, in the first and second examples according to the embodiment, variations among the differential pass characteristics Sdd21 were kept small even when the ΔY value was varied. Also in the first and second examples according to the embodiment, the attenuation amount represented by each differential pass characteristic Sdd21 was kept small throughout the given frequency range. In contrast, as seen from FIG. 11, the differential pass characteristics Sdd21 in the comparative example varied when the ΔY value was varied. Further, the attenuation amount represented by each differential pass characteristic Sdd21 in the comparative example was larger than that represented by the differential pass characteristics Sdd21 in the first and second examples according to the embodiment. Still further, in the comparative example, both the variations among the differential pass characteristics Sdd21 and the attenuation amounts became larger as the frequencies were increased.

As seen from FIGS. 8 and 10, in the first and second examples according to the embodiment, variations among the differential-to-common mode conversion characteristics Scd21 were kept within a certain extent even when the ΔY value was varied. Also in the first and second examples according to the embodiment, the conversion degree represented by each differential-to-common mode conversion characteristic Scd21 was kept low. In contrast, as seen from FIG. 12, the differential-to-common mode conversion characteristics Scd21 in the comparative example varied to a larger extent than those of the first and second examples according to the embodiment, when the ΔY value was varied. Further, the conversion degree represented by each differential-to-common mode conversion characteristic Scd21 in the comparative example was larger than the conversion degree represented by the differential-to-common mode conversion characteristics Scd21 in the first and second examples according to the embodiment.

As such, it has been confirmed from the simulations that constituting the printed board in such a manner as to make a pitch between the differential interconnects an integer (1 or greater) multiple of the cycle of thickness change in the insulator's weave structure enables suppression of variations in characteristics of the interconnects.

[3] Further Aspects, Modifications, Etc.

During the manufacture of printed boards, a manufacturing error could be involved in the pitch between interconnects and also in the cycle of thickness change in each insulator's weave structure. Accordingly, the influence of manufacturing errors is taken into account when checking or determining whether or not the pitch between differential interconnects conforms to an integer (1 or greater) multiple of the cycle of thickness change in the weave structure. A description will be given, with reference to FIG. 4, of how the influence of manufacturing errors is considered, assuming an instance where the printed board 10 as in the foregoing embodiment is manufactured and its sectional structure is observed.

In the actual manufacture of the printed board 10, each interval between the neighboring upper and lower portions of the produced insulator 102 could be influenced by a manufacturing error. As a result, intervals between the respective pairs of neighboring upper and lower portions, if measured through observation of the cross-section, could become larger or smaller than the cycle P2 depending on the measurement locations.

It is therefore preferable to take into account the influence of manufacturing errors based on, for example, the sectional structure of the printed board, for estimating the relationship of the pitch between differential interconnects to the cycle of thickness change in the weave structure. Examples of taking the influence of a manufacturing error into account include a method of measuring the interval, determining a distance corresponding to the cycle of thickness change in the weave structure based on the measurement result and the influence of the manufacturing error, and comparing this distance with the pitch between the interconnects. In more concrete terms, the method first measures the interval between the neighboring upper and lower portions of the component corresponding to the insulator 102. Then, a first distance is determined based on the result of measuring the interval and a predicted measurement error. The first distance and the pitch between differential interconnects are compared to each other to determine whether or not the pitch between the differential interconnects conforms to an integer (1 or greater) multiple of the cycle of thickness change in the weave structure.

There are various ways of determining the first distance.

One example is by measuring the interval between neighboring upper and lower portions at two locations, and using the results of measuring these first and second location intervals to determine the first distance. The first distance may be an intermediate value, an average value, or the like of the results of measuring the first and second location intervals. Also, such first and second location intervals may be acquired from a single cross-section corresponding to FIG. 4, or one of them may be acquired from the cross-section corresponding to FIG. 4 while acquiring the other from a cross-section parallel to the cross-section corresponding to FIG. 4 and located in the depth direction of FIG. 4.

Another example is by measuring the interval at multiple locations, calculating an average and a standard deviation from the results of measuring the multiple intervals, and determining the first distance based on these average and standard deviation. To this end, it is possible, for example, to measure the interval at one hundred locations, calculate an average AVR and a standard deviation σ from the results of measuring the one hundred location intervals, and adopt the range represented by AVR±2×σ as the first distance.

Manufacturing errors may also be taken into account in instances of measuring the pitch between interconnects. For example, when a conductor which functions as the interconnect has a width (corresponding to the width W2 shown in FIG. 5) that varies between its upper side and lower side, the center of the wider width portion may be adopted as the center of this conductor.

For the foregoing embodiment, the description has assumed an exemplary structure in which the conductors 14a and 14b functioning as interconnects for transmitting differential signals are sandwiched by the ground layers. An interconnect located between ground layers is called, for example, a "strip line". The multiple interconnects for transmitting signals are not limited to strip lines. For other exemplary structures, the interconnects for transmitting signals may be sandwiched by power layers, i.e., conductor layers adapted to receive application of a source voltage, or sandwiched by a power layer and a ground layer. Note that the source voltage here corresponds to a source potential in the electronic device 1. In a further example, the interconnects may be sandwiched by conductor layers to which a given voltage is applied, or sandwiched by conductor layers to which different, respective voltages are applied.

Figure 13:
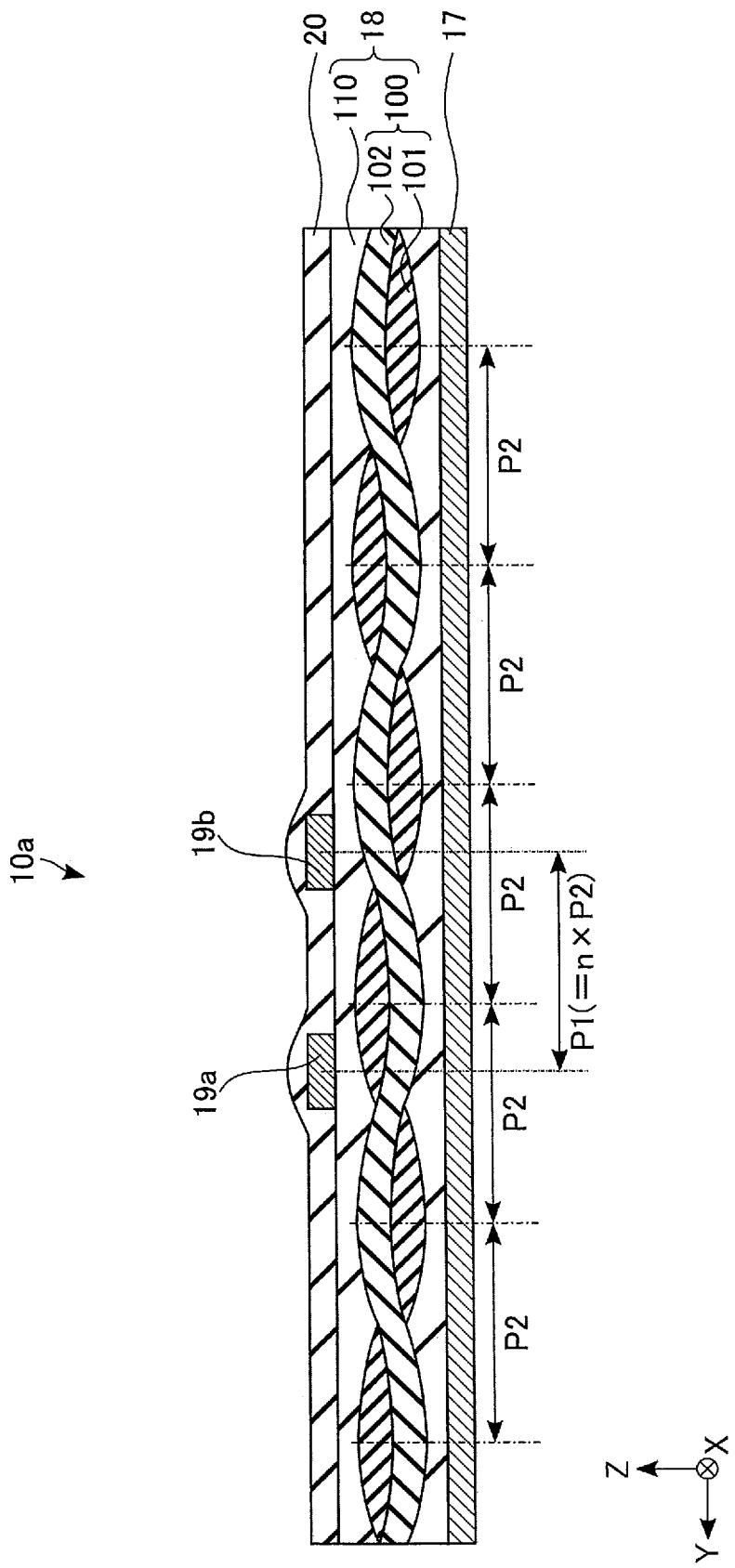
FIG. 13 is a sectional view of a part of a printed board according to a first modification of the embodiment.

FIG. 13 is a sectional view of a part of a printed board according to one modification (a first modification) of the embodiment. As shown in FIG. 13, the printed board according to this first modification, denoted by "10a", differs from the printed board 10 according to the embodiment in that it has a structure in which a pair of differential interconnects for transmitting differential signals is replaced with a pair of conductors 19a and 19b. The illustration of FIG. 13 focuses on the part including the conductors 17, 19a, and 19b, and the insulators 18 and 20 among the printed board 10a. The conductors 19a and 19b contact the insulator 18 at a lower sides thereof. The conductors 19a and 19b each extends in the X direction. The conductors 19a and 19b are arranged along the Y direction. The Y-direction pitch for the conductors 19a and 19b is set to the pitch P1. The pitch P1 is an integer (1 or greater) multiple of the cycle P2 of the weave structure 100 included in the insulator 18. The insulator 20 covers an upper side of the conductors 19a and 19b. The insulator 20 also covers the regions of an upper side of the insulator 18, where the conductors 19a and 19b is absent. The conductor 17 is a ground layer. The interconnects in such an arrangement, i.e., adjacent to a ground layer via an insulator at one side while being adjacent to the outside of the printed board via another insulator at the other side, are also called micro strip lines. The multiple interconnects for transmitting signals may be micro strip lines as shown in FIG. 13. Note that the printed board 10a according to the first modification may omit the insulator 20.

For the foregoing embodiment, the description has assumed an exemplary structure in which the antinode position of the weave structure 100 included in the insulator 11 and the antinode position of the weave structure 100 included in the insulator 16 are aligned with each other in the Y direction. However, the antinode positions of the respective weave structures 100 included in the insulators 11, 16, and 18 are not required to be aligned with one another in the Y direction.

For the foregoing embodiment, the description has assumed an exemplary structure in which each of the insulators 11, 16, and 18 includes one weave structure 100. However, the number of weave structures 100 included in each insulator is not limited to one. For example, the insulators 11, 16, and 18 may each be formed to include multiple weave structures 100 stacked along the Z direction.

For the foregoing embodiment, the description has assumed an exemplary structure in which the transmitter 2 and the receiver 3 are provided on the printed board 10. However, the transmitter 2 and the receiver 3 are not required to be disposed on the printed board 10.

FIG. 14 is a plan view showing an exemplary structure of an electronic device according to one modification (a second modification) of the embodiment. As shown in FIG. 14, the electronic device according to this second modification, denoted by "1a", includes its transmitter 2, receiver 3, and also printed boards 10-1 and 10-2 and a socket SK. The printed board 10-1 includes conductors 14a-1 and 14b-1. The printed board 10-2 includes a connector portion CC and conductors 14a-2 and 14b-2.

The transmitter 2 and the socket SK are disposed on the printed board 10-1. The transmitter 2 and the socket SK are electrically connected to each other via the conductors 14a-1 and 14b-1. The conductors 14a-1 and 14b-1 function as a pair of interconnects (or substrate wirings, or printed wirings) for transmitting differential signals. The conductors 14a-1 and 14b-1 each extends in the X direction and are arranged along the Y direction. The Y-direction pitch between the conductors 14a-1 and 14b-1 is an integer (1 or greater) multiple of the cycle of thickness change in the weave structure that is included in an insulator adjacent to the conductors 14a-1 and 14b-1 in the Z direction.

The receiver 3 is disposed on the printed board 10-2. The connector portion CC is configured so that it is electrically connectable to the socket SK. The receiver 3 and the connector portion CC are electrically connected to each other via the conductors 14a-2 and 14b-2. The conductors 14a-2 and 14b-2 function as a pair of interconnects (or substrate wirings, or printed wirings) for transmitting differential signals. FIG. 14 illustrates a state where the connector portion CC is fitted in the socket SK. In this state, the conductors 14a-2 and 14b-2 each extends in the X direction and are arranged along the Y direction. The Y-direction pitch between the conductors 14a-2 and 14b-2 is an integer (1 or greater) multiple of the cycle of thickness change in the weave structure that is included in an insulator adjacent to the conductors 14a-2 and 14b-2 in the Z direction.

The transmitter 2 and the receiver 3 are electrically connected to each other via the conductors 14a-1 and 14b-1, the socket SK, the connector portion CC, and the conductors 14a-2 and 14b-2.

Also for the form of interconnects (or substrate wirings, or printed wirings) connecting an IC chip with a socket and the form of interconnects (or substrate wirings, or printed wirings) connecting a connector with an IC chip, the same effects and advantages as in the foregoing embodiment can be obtained by adopting a structure in which the pitch between the differential interconnects is set to be an integer (1 or greater) multiple of the cycle of thickness change in the insulator's weave structure as described above.

For the foregoing embodiment, the description has assumed instances where the conductors 14a and 14b forming a pair transmit differential signals. However, a type of signals transmitted through a set of multiple interconnects is not limited to differential signals, but may be any type of signals including multiphase signals such as three-phase signals and five-phase signals. Here, the number of multiple interconnects is not limited to two, which corresponds to the configuration for a differential signal, but may be three corresponding to the configuration for a three-phase signal, five corresponding to the configuration for a five-phase signal, and so on.

FIG. 15 is a sectional view of a part of a printed board according to one modification (a third modification) of the embodiment. As shown in FIG. 15, the printed board according to this third modification, denoted by "10b", differs from the printed board 10 according to the embodiment in that it has a structure in which a set of interconnects for transmitting differential signals further includes conductors 14c to 14e. The illustration of FIG. 15 focuses on the part including the conductors 12, 14a to 14e and 17, and the insulators 11, 15 and 16 among the printed board 10b. The conductors 14a to 14e serve as a set of multiphase-signal interconnects (or substrate wirings, or printed wirings) for transmitting five-phase signals from the transmitter 2 to the receiver 3. The conductors 14c to 14e each contacts the insulator 11 at a lower sides thereof, in the same manner as each of the conductors 14a and 14b. The conductors 14c to 14e each extends in the X direction, in the same manner as each of the conductors 14a and 14b. The conductors 14a to 14e are arranged along the Y direction. Of the conductors 14a to 14e, every two conductors 14 next to each other in the Y direction have a Y-direction pitch therebetween equal to the pitch P1. The pitch P1 is an integer (1 or greater) multiple of the cycle P2 of the weave structure 100 included in the insulator 11. The other aspects of the printed board 10b are substantially the same as those of the printed board 10. As such, the printed board according to the third modification of the embodiment includes multiple conductors for transmitting multiphase signals, which are arranged at regular pitches P1. Therefore, the printed board 10b can suppress the variations in characteristics of the interconnects in a manner similar to the printed board 10 according to the embodiment.

For the foregoing embodiment, the description has assumed an exemplary structure in which the transmitter 2 and the receiver 3 are disposed on the top face of the printed board 10. The technique of furnishing components to only one side of a printed board is called, for example, "single-side mounting". However, the component furnishing technique for the printed board is not limited to single-side mounting. For example, the technique of furnishing components to both the top face and the bottom face of the printed board, namely, "dual-side mounting", may instead by adopted.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

The invention claimed is:

1. A printed board comprising:
    a first insulator and a second insulator each extending in a first direction, the first insulator and the second insulator being next to each other along a second direction crossing the first direction;
    a third insulator extending in the second direction and including a first portion and a second portion, the first portion overlapping the first insulator and located above the first insulator in a third direction crossing the first direction and the second direction, the second portion overlapping the second insulator and located below the second insulator in the third direction;
    a fourth insulator located next to the third insulator in the first direction, extending in the second direction, and including a third portion and a fourth portion, the third portion overlapping the first insulator and located below the first insulator in the third direction, the fourth portion overlapping the second insulator and located above the second insulator in the third direction;
    a fifth insulator and a sixth insulator each extending in the first direction, the fifth insulator and the sixth insulator being next to the first insulator or the second insulator along the second direction; and
    a first conductor and a second conductor each extending in the first direction, and arranged along the second direction with a first pitch therebetween, wherein
    the first pitch is an n multiple of a first distance that is based on an interval between the first portion and the second portion or an interval between the third portion and the fourth portion, wherein the n is an integer equal to or greater than 1,
    the third insulator further includes a fifth portion and a sixth portion, the fifth portion overlapping the fifth insulator and located above the fifth insulator in the third direction, the sixth portion overlapping the sixth insulator and located below the sixth insulator in the third direction,
    the fourth insulator further includes a seventh portion and an eighth portion, the seventh portion overlapping the fifth insulator and located below the fifth insulator in the third direction, the eighth portion overlapping the sixth insulator and located above the sixth insulator in the third direction, and
    the first distance is further based on an interval between the fifth portion and the sixth portion or an interval between the seventh portion and the eighth portion.

2. The printed board according to claim 1, wherein the first distance is a length between a length of the interval between the first portion and the second portion and a length of the interval between the fifth portion and the sixth portion, or a length between a length of the interval between the first portion and the second portion and a length of the interval between the seventh portion and the eighth portion.

3. The printed board according to claim 1, further comprising
 a seventh insulator extending in the second direction and including a ninth portion and a tenth portion, the ninth portion overlapping the first insulator and located above the first insulator in the third direction, the tenth portion overlapping the second insulator and located below the second insulator in the third direction, and
 an eighth insulator located next to the seventh insulator in the first direction, extending in the second direction, and including an eleventh portion and a twelfth portion, the eleventh portion overlapping the first insulator and located below the first insulator in the third direction, the twelfth portion overlapping the second insulator and located above the second insulator in the third direction,
 wherein the first distance is further based on an interval between the ninth portion and the tenth portion or an interval between the eleventh portion and the twelfth portion.

4. The printed board according to claim 1, further comprising a third conductor extending in the first direction and the second direction,
 wherein the first conductor and the second conductor are located above the first to fourth insulators in the third direction, and the third conductor is located below the first to fourth insulators in the third direction.

5. The printed board according to claim 1, further comprising
 a ninth insulator and a tenth insulator each extending in the first direction, the ninth insulator and the tenth insulator being next to each other along the second direction,
 an eleventh insulator extending in the second direction and including a thirteenth portion and a fourteenth portion, the thirteenth portion overlapping the ninth insulator and located above the ninth insulator in the third direction, the fourteenth portion overlapping the tenth insulator and located below the tenth insulator in the third direction,
 a twelfth insulator located next to the eleventh insulator in the first direction, extending in the second direction, and including a fifteenth portion and a sixteenth portion, the fifteenth portion overlapping the ninth insulator and located below the ninth insulator in the third direction, the sixteenth portion overlapping the tenth insulator and located above the tenth insulator in the third direction, and
 a fourth conductor extending in the first direction and the second direction, wherein
 an interval between the thirteenth portion and the fourteenth portion or an interval between the fifteenth portion and the sixteenth portion equals to the interval between the first portion and the second portion or the interval between the third portion and the fourth portion,
 the ninth to twelfth insulators are located above the first conductor and the second conductor in the third direction, and the fourth conductor is located above the ninth to twelfth insulators in the third direction.

6. The printed board according to claim 1, further comprising a thirteenth insulator filling one or more spaces in the first to fourth insulators and covering the first to fourth insulators,
 wherein the first conductor and the second conductor are each in contact with the thirteenth insulator.

7. The printed board according to claim 6, wherein a thickness in the third direction of the thirteenth insulator at a position where the thirteenth insulator overlaps the first portion or the second portion in the third direction is smaller than that at a position where the thirteenth insulator overlaps a portion between the first portion and the second portion.

8. The printed board according to claim 6, wherein a sum of respective thicknesses of the thirteenth insulator and any one of the first to fourth insulators along the third direction is substantially constant along the first direction and the second direction.

9. The printed board according to claim 6, wherein the thirteenth insulator comprises an epoxy resin.

10. The printed board according to claim 6, wherein the first to fourth insulators each has a relative permittivity differing from that of the thirteenth insulator.

11. The printed board according to claim 1, wherein the first to fourth insulators each comprises glass fiber.

12. The printed board according to claim 1, wherein the first conductor and the second conductor are a pair of interconnects for transmitting a differential signal.

13. The printed board according to claim 1, further comprising a third conductor extending in the first direction and arranged next to the first conductor or the second conductor along the second direction with the first pitch,
 wherein the first to third conductors are interconnects for transmitting a multiphase signal.

14. An electronic device comprising:
 the printed board according to claim 1; and
 a first device on the printed board and electrically connected to the first and second conductors.

15. The electronic device according to claim 14, further comprising:
 a second device on the printed board and electrically connected to the first and second conductors.

16. The electronic device according to claim 14, wherein the printed board further comprises a third conductor extending in the first direction and the second direction,
 wherein the first conductor and the second conductor are located above the first to fourth insulators in the third direction, and the third conductor is located below the first to fourth insulators in the third direction.

17. The electronic device according to claim 14, wherein the printed board further comprises a thirteenth insulator filling one or more spaces in the first to fourth insulators and covering the first to fourth insulators,
 wherein the first conductor and the second conductor included in the printed board are each in contact with the thirteenth insulator.

18. The electronic device according to claim 14, wherein the first to fourth insulators included in the printed board each comprises glass fiber.

19. A printed board comprising:
 a first insulator and a second insulator each extending in a first direction, the first insulator and the second insulator being next to each other along a second direction crossing the first direction;
 a third insulator extending in the second direction and including a first portion and a second portion, the first portion overlapping the first insulator and located above the first insulator in a third direction crossing the first direction and the second direction, the second portion overlapping the second insulator and located below the second insulator in the third direction;
 a fourth insulator located next to the third insulator in the first direction, extending in the second direction, and including a third portion and a fourth portion, the third portion overlapping the first insulator and located below the first insulator in the third direction, the fourth portion overlapping the second insulator and located above the second insulator in the third direction;

a fifth insulator extending in the second direction and including a fifth portion and a sixth portion, the fifth portion overlapping the first insulator and located above the first insulator in the third direction, the sixth portion overlapping the second insulator and located below the second insulator in the third direction;

a sixth insulator located next to the fifth insulator in the first direction, extending in the second direction, and including a seventh portion and an eighth portion, the seventh portion overlapping the first insulator and located below the first insulator in the third direction, the eighth portion overlapping the second insulator and located above the second insulator in the third direction; and a first conductor and a second conductor each extending in the first direction, and arranged along the second direction with a first pitch therebetween, wherein the first pitch is an n multiple of a first distance that is based on an interval between the first portion and the second portion or an interval between the third portion and the fourth portion, wherein the n is an integer equal to or greater than 1, and the first distance is further based on an interval between the fifth portion and the sixth portion or an interval between the seventh portion and the eighth portion.

20. An electronic device comprising:

the printed board according to claim 19; and a first device on the printed board and electrically connected to the first and second conductors.

* * * * *